United States Patent [19]

Kim

[11] Patent Number: 5,610,538

[45] Date of Patent: Mar. 11, 1997

[54] BUFFER APPARATUS HAVING A LOW OUTPUT IMPEDANCE

[75] Inventor: Young H. Kim, Seoul, Rep. of Korea

[73] Assignee: Korea Telecommunication Authority, Rep. of Korea

[21] Appl. No.: 516,149

[22] Filed: Aug. 17, 1995

[30] Foreign Application Priority Data

Aug. 17, 1994 [KR] Rep. of Korea .................. 1994-20298

[51] Int. Cl.⁶ ...................... H03K 19/0948; H03K 19/01; H03K 19/08

[52] U.S. Cl. .................. 326/87; 326/83; 326/85; 326/17; 327/170

[58] Field of Search .................... 326/83, 86–87, 326/84–85, 110, 121, 17–18, 30; 327/170, 374, 376, 380–381, 389, 391

[56] References Cited

U.S. PATENT DOCUMENTS 5,027,014  6/1991  Bass et al. ................... 326/17
5,338,987  8/1994  Tomasetti et al. ............ 326/85
5,489,862  2/1996  Risinger et al. .............. 326/83

Primary Examiner—Edward P. Westin
Assistant Examiner—Jon Santamauro
Attorney, Agent, or Firm—Merchant, Gould, Smith, Edell, Welter & Schmidt

[57] ABSTRACT

A buffer apparatus having a low output impedance includes a first transistor having one terminal coupled to a voltage source, the other terminal coupled to an output terminal of the buffer, and a gate which receives an input signal of the buffer; a second transistor having one terminal coupled to the output terminal of the buffer and a gate which receives the input signal of the buffer; a current sensing circuitry, which is coupled to the other terminal of the second transistor, for sensing a current of the second transistor and amplifying an input current which flows to the second transistor; a voltage driving circuitry, which is formed between the output terminal of the buffer and a ground voltage, for decreasing an output voltage of the buffer by passing the current from the output terminal to the ground voltage according to a control signal which is applied to the voltage driving circuitry.

7 Claims, 4 Drawing Sheets

BUFFER APPARATUS HAVING A LOW OUTPUT IMPEDANCE

FIELD OF THE INVENTION

The present invention relates to a buffer. More specifically, the present invention relates to a buffer for driving a load circuit having a small output resistance in the CMOS process.

BACKGROUND ART

Application of CMOS circuits have been quickly developed along with the development of integrated circuit techniques, and there has been continuous efforts for making the whole system as one chip.

Advantages of CMOS circuits are: they have a high packing density, and they can be easily designed for short time. These advantages have had many contributions to the development of the CMOS VLSI circuit's design and their implementation.

However, there is a problem in spite of the many advantages. This problem appears in the driving capability of the CMOS. A CMOS device has a far lower driving capability than a biploar transistor(BJT). This is why the ratio of the input voltage to the output current of a BJT device is an exponential, whereas the ratio of input voltage to output current of CMOS device is linear. The ratio of input voltage to output current of each device is as follows. bipolar transistor (BJT:NPN type):

$$Ic = I_{CBO} \cdot [e^{(V_{BE}/V_T)} - 1]$$

field effect transistor (MOS:NMOS):

$$I_{DS} = \frac{1}{2} K_P \frac{W}{L} (V_{GS} - V_{T_n})^2$$

Where, Ic is a collector current in the NPN bipolar transistor, $I_{CBO}$ is a reverse saturation current when the base of the transistor is open, and $V_{BE}$ is an applied voltage between the base and the emitter of the transistor.

Also, $$V_T = \frac{KT}{q},$$

where, k is Bolzman constant, T is an absolute temperature, and q is the amount of electric charge. $I_{DS}$ is the current between the drain and the source in a N channel MOS transistor, Kp is the input/output transfer conductance per unit, $V_{GS}$ is the applied voltage between the gate and the source in a NMOS transistor, and $V_{T_n}$ is the threshold voltage of the transistor.

A large increase or decrease in the output current is made by a minute change in the input voltage, as it is known from the above equations, because the bipolar transistor has a property that the ratio of input/output voltage to collector current is an exponential function. Therefore, although the resistance of a load on the output terminal is very small, but it has the ability to drive a current. The input voltage of MOS transistor has to be very large when resistance of a load on the output terminal is small, because the MOS transistor has a property that the ratio of the input/output voltage-current characteristics is linear. Therefore, a MOS transistor has less ability to drive a circuit with a large load than a bipolar transistor.

Another important problem is to integrate a system into one chip, which is increasing according to the increase of a CMOS circuit's application field. In other words, there is an interface problem between the inside circuit of a chip and the outside circuit, this problem is how to drive a large load of the outside circuit. This problem occurrs in an analog circuit as well as in a digital circuit. There is a need to have buffers for driving a circuit with a large load (i.e. resistors with small resistance, or capacitors with a very large capacitance). Up to now, a buffer using a push-pull structure was generally used for satisfying this demand.

FIG. 1 is a diagram illustrating a push-pull circuit according to the prior art.

The push-pull circuit consists of two transistors NI and P1. Reference numeral N1 is a NMOS transistor and acts as a pull up device, which pulls up the same output signal as the input signal, when its input signal increases to positive. P1 is a PMOS transistor and acts as a pull down device, which pulls down the same output signal as the input signal, when its input signal decreases to negative.

An illustration about the on/off states of the two transistors will be described in accordance with the operation flows.

If the input signal increases, N1 becomes on, and P1 becomes off. Also, if the input signal decreases, N1 becomes off, and P1 becomes on and pulls down the output signal.

If the input signal increases, and if the output load is large, the current to the output must become large, so that the voltage between the gate and the source must increase largely.

However, an increase of voltage between the gate and the source makes the performance of the buffer limited. The voltage between the gate and the source is determined by the input/output transfer characteristics of the MOS transistor. It is determined by the NMOS transistor in the case of a pull-up and is determined by the PMOS transistor in the case of a pull-down. Generally, the size of NMOS transistor is two or three times that of PMOS transistor (mobility of holes which are majority carriers of a PMOS transistor is less than that of electrons which are majority carriers of NMOS transistor). Therefore, the size of the PMOS transistor will have to be enlarged, in order that the transfer characteristics in pull-up is the same as that in a pull-down, i.e., in order that the driving capability-of a NMOS transistor is the same as that of a PMOS transistor. Then, there are some problems in that the size of the whole system circuit is enlarged, and the parasitic capacitance of the input stage is enlarged, so that its performance level goes down.

SUMMARY OF THE INVENTION

Therefore, an object of the present invention is to provide a buffer of which the driving capability is improved by the improvement of the transfer characteristics of pull-up and pull-down, and which has a low output impedance.

In one embodiment of the present invention, there is provided a buffer apparatus including a first transistor having one terminal coupled to a voltage source, the other terminal coupled to the output terminal of the buffer, and a gate which receives a input signal of the buffer; a second transistor having one terminal coupled to the output terminal of the buffer and a gate which receives the input signal of the buffer; a current sensing means which is coupled to the other terminal of the second transistor, for sensing the current of the second transistor and amplifying the input current which flows to the second transistor; a voltage driving means which is formed between the output terminal of the buffer and a ground voltage, for decreasing the output voltage of the buffer by passing the current from the output terminal to the ground voltage according to the control signal which is applied to the voltage driving means.

BRIEF DESCRIPTION OF THE DRAWINGS

The present invention will be described in more detail below by way of example with the aid of drawings.

DETAIL DESCRIPTION OF THE PREFERRED EMBODIMENT

The present invention will be described with reference to FIG. 2 through FIG. 5.

Figure 2:
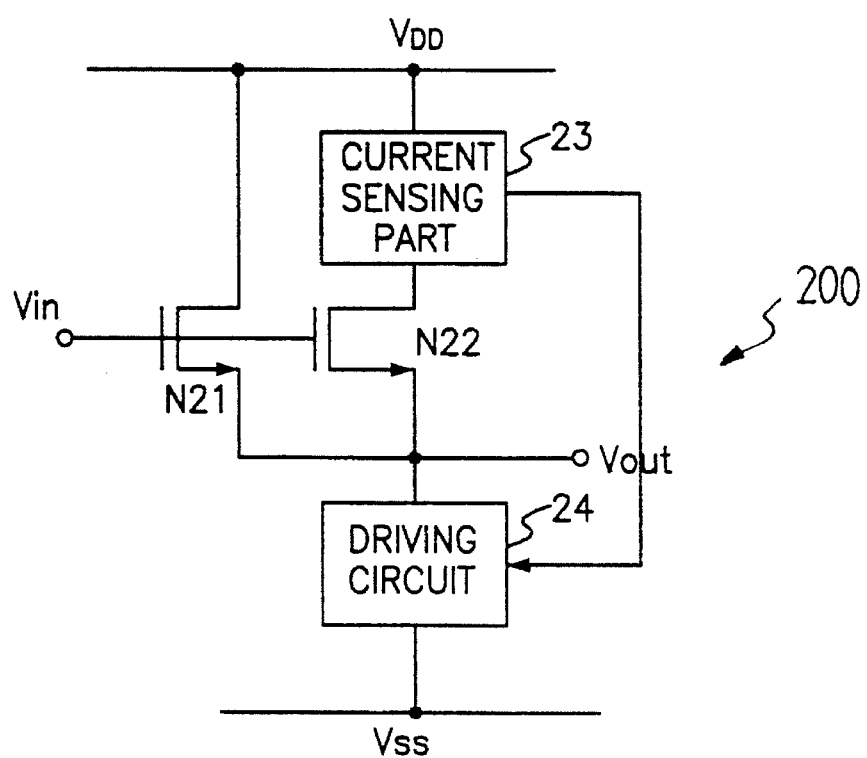
FIG. 2 is a circuitry diagram of the invention.

Referring now to FIG. 2, a diagram illustrating the invention is shown. An input voltage $V_{in}$ is applied to the gate of the NMOS transistors N21 and N22. The transistor N21, of which one terminal is coupled to a voltage source $V_{DD}$ and of which the other terminal is coupled to a output terminal $V_{out}$ of the buffer 200, increases the output voltage $V_{out}$ of the buffer 200. Also, one terminal of the transistor N22 is coupled to the output terminal $V_{out}$ of the buffer 200, and the other terminal of it is coupled to a current sensing part 23 which is applied the voltage source $V_{DD}$ to. Furthermore, the output terminal $V_{out}$ of the buffer 200 is connected with a driving circuit 24 which is connected with a ground voltage $V_{ss}$. The driving circuit 24 is controlled by the current sensing part 23.

Figure 1:
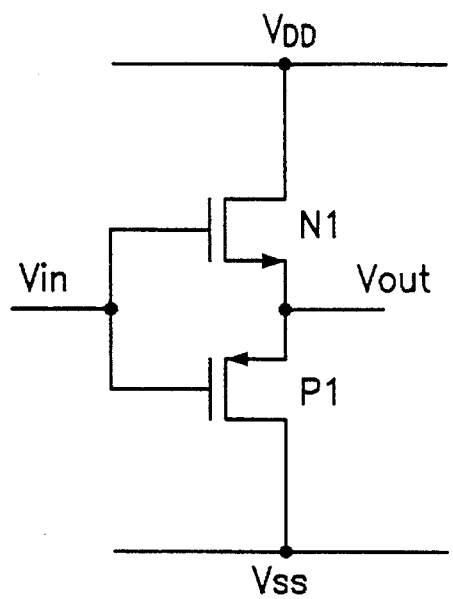
FIG. 1 is a circuitry diagram of a prior CMOS class B push-pull buffer.

The NMOS transistor N21 acts as a pull-up transistor, much like the transistor N1 in FIG. 1, and increases the output signal when its input signal increases. The NMOS transistor N22 receives a decreasing input signal and decreases the current on the output terminal, drain terminal, when its input signal decreases. The current sensing part 23 connected with the source of the transistor N22 senses a decrease of the current and provides the driving circuit 24 with this sensing signal. The signal inputted into the driving circuit 24 controls the voltage of the output terminal, i.e., the input signal makes the voltage of the output terminal decrease, so that limitations on the driving capability of the transistor N22 can be overcome.

Figure 3:
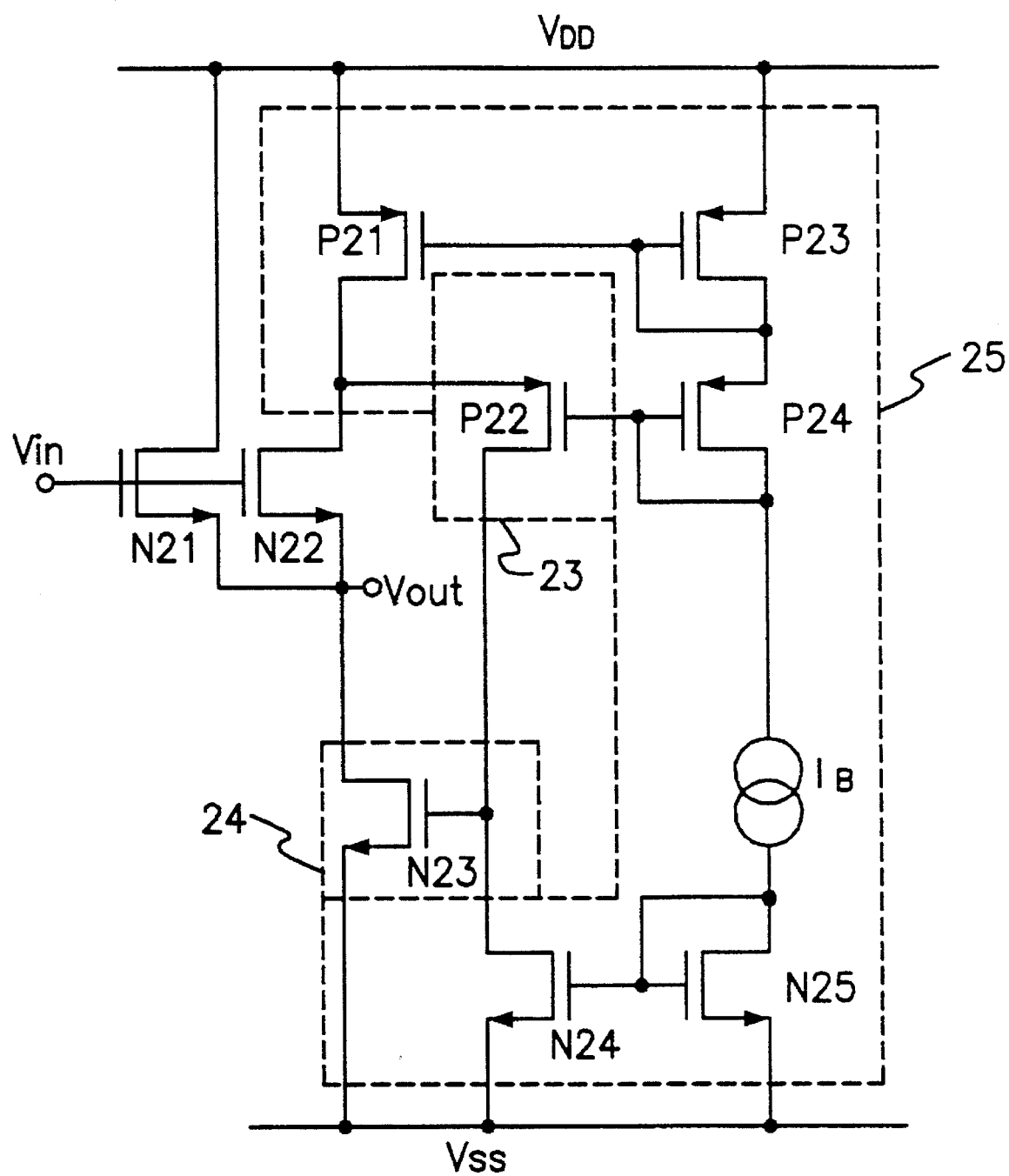
FIG. 3 is a ciruimry diagram of a whole CMOS buffer in accordance with the present invention.

FIG. 3 shows the circuit of FIG. 2 in more detail. As illustrated in FIG. 3, the NMOS transistor N21 is a pull-up device, which increases the output voltage corresponding to the input voltage when the input voltage becomes larger, and the NMOS transistor N22 senses the input voltage and changes the output current outputted of the PMOS transistor P22. One terminal of the NMOS transistor N22 is coupled to output terminal of the buffer 200, and the other terminal of that is one terminal of the PMOS transistor which consists in the current sensing part 23.

Furthermore, a bias circuit of which is well-known to those skilled in prior art, for biasing the buffer 200, consists of PMOS transistors P21, P23, and P24 and NMOS transistors N24 and N25. One terminal of the PMOS transistor P21 is coupled to the voltage source $V_{DD}$, and the other terminal is coupled to the current sensing part 23.

The PMOS transistors P23 and P24 have a gate connected with the drain, respectively. The NMOS transistor N25 has a gate connected with its drain. Also, the gate of the PMOS transistor P23 is coupled to that of the PMOS transistor P21, and the source of it is coupled to the voltage source $V_{DD}$. The gate of the PMOS transistor P24 is coupled to that of the PMOS transistor P22, and the drain of it is coupled to the source of the PMOS transistor P23. Furthermore, a current source $1_B$ exists between the source of the PMOS transistor P24 and the source of the NMOS transistor N25, whose drain is connected with the ground-voltage $V_{ss}$. The source of the NMOS transistor N24, which has a gate connected with the gate of the NMOS transistor N25, is coupled to the source of the PMOS transistor P22 and the gate of the NMOS transistor N23, and its drain is connected with the voltage source $V_{ss}$.

The description of the circuitry operation will be followed in detail. First, the feedback circuit will be illustrated. The transistor P22 amplifies the sensed current from the transistor N20 and provides the gate of the transistor N23 with the amplified signal. Three transistors, N22, N23, and P22, are formed into a feedback loop and act as a pull-down transistor by some operation, i.e., when the input voltage signal decreases, "a decrease in the current of the transistor N22 →an increase in the current of the transistor P22→an increase in the voltage of the gate of transistor N23 →an increase in the current of the drain of transistor N23→a decrease in the output voltage of the buffer".

As stated above, if a buffer is implemented by using the feedback circuit, the output value of the whole circuit will be very small, because the loop gain of the feedback circuit is large, so that performance of the circuit is very good.

The output resistance of a circuit is expressed as follows.

$$\gamma_{out} = \frac{1}{g_{m_1} + g_{m_2}} \cdot \frac{1}{(1-T)}$$

Where, $\gamma_{out}$ is transconductance of the output resistance, $g_{m_1}$ and $g_{m_2}$ are transconductances of the transistors N21 and N23, respectively. In the above equation, T is a loop gain of the feedback circuit, and T is expressed as follows.

$$T = -g_{m_3} \frac{g_{m_2}}{g_{m_1} + g_{m_2}} \gamma_{out4}$$

Where, $g_{m_3}$ is transconductance of the transistor N23, and $\gamma_{out4}$ is an output resistance of the transistor N24, respectively. The output resistance of the buffer is expressed as follows.

$$\gamma_{out} = \frac{1}{g_{m_1} + g_{m_2}(1 + g_{m_3}\gamma_{out4})}$$

In the above equation, since the loop gain, $g_{m_3} \cdot r_{out4}$, is large, the output resistance decreases. The feedback circuit can be used as a useful circuit to implement a buffer having almost ideal input/output transfer characteristics.

Figure 4:
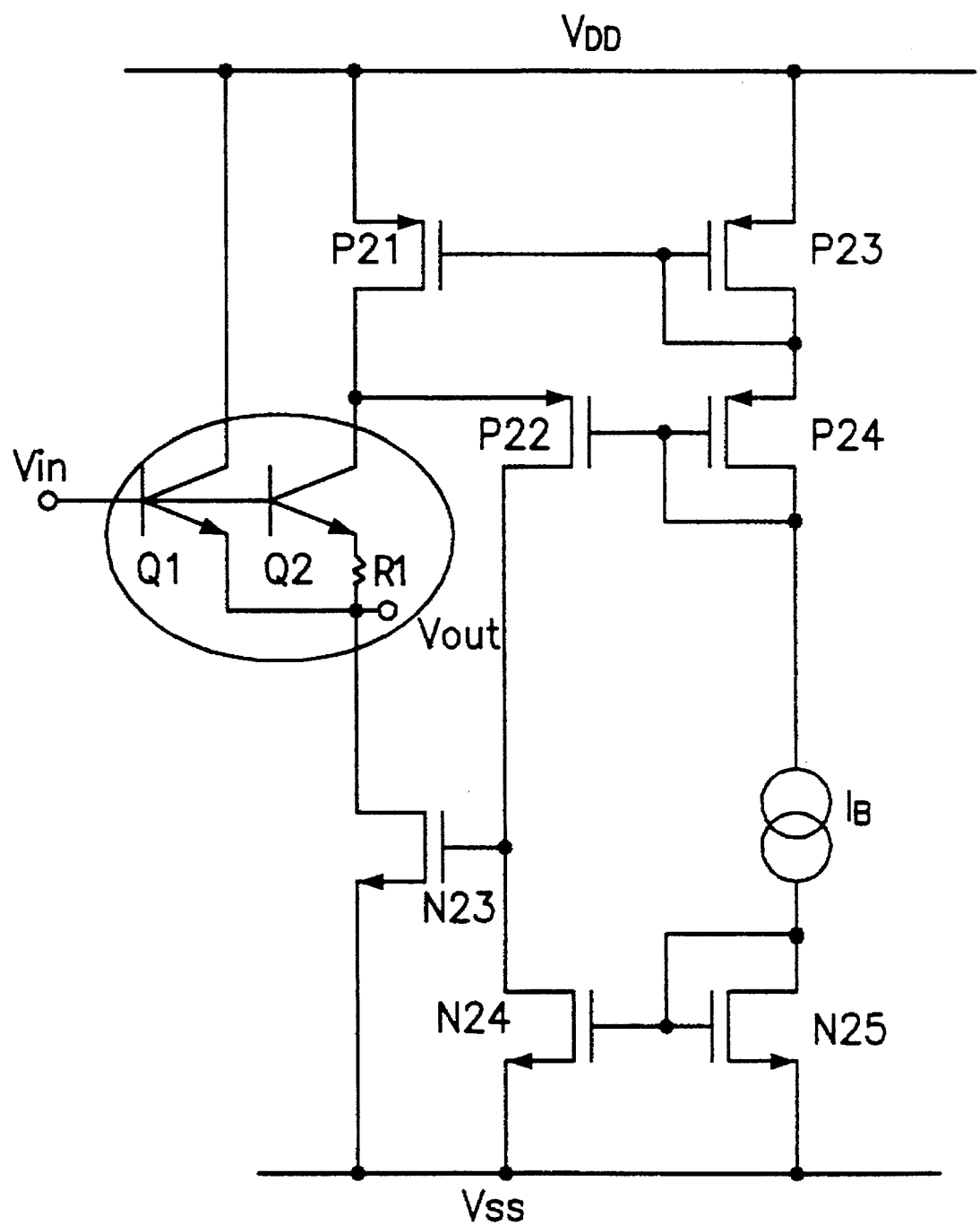
FIG. 4 is a circuitry diagram of BiCMOS by means of P-Well process.
Figure 5:
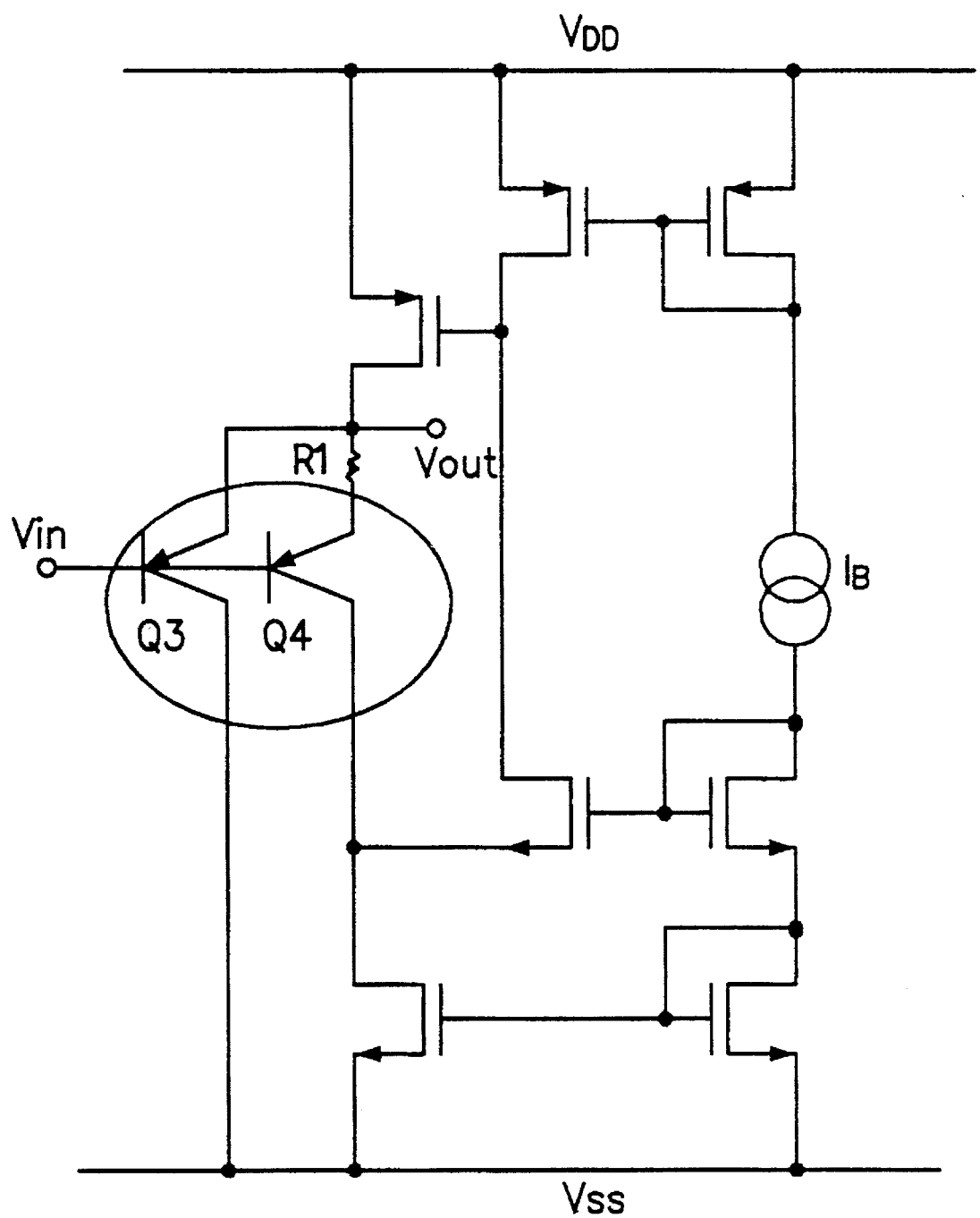
FIG. 5 is a circuitry diagram of BiCMOS by means of N-Well process.

FIG. 4 shows a circuit illustrating another embodiment, which implements a buffer by using BiCMOS.

First, the same reference numeral designates the same element in FIG. 3 in another embodiment in which NMOS transistors N21 and N22 are replaced with bipolar transistors 01 and Q2. A resistor R1 exists between one terminal of the bipolar transistor Q2 and the output terminal of the buffer 200. The implementation of bipolar transistors can be achieved by using bipolar transistors provided in a BiCMOS process. In general CMOS process, the bipolar transistors can be implemented by parasitic bipolar transistor. In this case, a letteral bipolar transistor is used as a transistor for sensing current 02, and a vertical bipolar transistor of which collector is substrate is used as a pull-up device Q1. In FIG. 4, in case where the CMOS process is p-well process,. a parasitic bipolar transistor can be implemented by a NPN type transistor. When the CMOS process is n-well process, a bipolar transistor is PNP type transistor, which is implemented as in FIG. 5. If NPN transistors Q1 and Q2 are replaced with PNP transistors Q3 and Q4, the voltage source is replaced with $V_{ss}$, and PMOS transistor is replaced with a NMOS transistor, and then the circuit in FIG. 5 performs the same function as that in FIG. 4.

The buffer circuit implemented by the bipolar transistors has a better characteristics than a buffer circuit implemented by using pure CMOS process, because the driving capability of the bipolar transistor is larger than that of the CMOS transistor.

The output resistance of the circuit in FIG. 4 is expressed as follows:

$$\gamma_{out} = \frac{1}{g_{m_1} + g_{m_2}(1 + g_{m_3}\gamma_{out4})}$$

$$= \frac{1}{\frac{I_{c_1}}{V_T} + \frac{I_{c_2}}{V_T}(1 + g_{m_3}\gamma_{out4})}$$

$$= \frac{V_T}{I_{c_1} + I_{c_2}(1 + g_{m_3}\gamma_{out4})}$$

where, $$V_T = \frac{kT}{q},$$

$I_{c_1}$ and $I_{c_2}$ are currents of the collector of transistors Q1 and Q2.

The present invention can solve an important problem, in the CMOS VLSI circuit, the interface between the inside circuit and the outside of a chip, i.e., the limitation on the driving capability of the CMOS device by using the CMOS process or the BiCMOS process. It has an advantage in that it can remove increases in a parasitic capacitance of input from the increases in the size of the transistors.

In the foregoing specification the invention has been described with reference to specific exemplary embodiments thereof it will, however, be evident that various modifications and changes may be made thereto without departing from the broader spirit and scope of the invention as set forth in the appterminaled claims. The specification and drawings are accordingly to be regarded as illustrative rather than restrictive.

What is claimed is:

1. A buffer apparatus for an analog circuit, having a low output impedance, the buffer apparatus comprising:

a first transistor having a first terminal coupled to a voltage source, a second terminal coupled to an output terminal of the buffer, and a control terminal which receives an input signal of the buffer;

a second transistor having a first terminal coupled to the output terminal of the buffer and a control terminal which receives the input signal of the buffer;

a current sensing means, which is coupled to a second terminal of the second transistor, for sensing a current of the second transistor and amplifying an input current which flows to the second transistor, wherein the current sensing means includes a single stage feedback amplifier which maintains stability of the analog circuit; and a voltage driving means, which is formed between the output terminal of the buffer and a ground voltage, for decreasing an output voltage of the buffer by passing a current from the output terminal to the ground voltage according to a control signal which is applied to the voltage driving means.

2. A buffer apparatus having a low output impedance as claimed in claim 1, wherein the voltage driving means has a control terminal coupled to the current sensing means, a first terminal coupled to the output of the buffer, and a second terminal coupled to the ground voltage.

3. A buffer apparatus having a low output impedance as claimed in claim 1, wherein the first transistor and the second transistor comprise NPN bipolar transistors respectively, and a resistor coupled between the second NPN bipolar transistor and the output terminal of the buffer.

4. A buffer apparatus having a low output impedance as claimed in claim 1, wherein the first transistor and the second transistor comprise PNP bipolar transistors respectively, and a resistor coupled between the second PNP bipolar transistor and the output terminal of the buffer.

5. A buffer apparatus having a low output impedance, comprising:

a first transistor having a first terminal coupled to a voltage source, a second terminal coupled to an output terminal of the buffer, and a control terminal which receives an input signal of the buffer;

a second transistor having a first terminal coupled to the output terminal of the buffer and a control terminal which receives the input signal of the buffer;

a current sensing means, which is coupled to a second terminal of the second transistor, for sensing a current of the second transistor and amplifying an input current which flows to the second transistor;

a voltage driving means, which is formed between the output terminal of the buffer and a ground voltage, for decreasing an output voltage of the buffer by passing a current from the output terminal to the ground voltage according to a control signal which is applied to the voltage driving means; and wherein the current sensing means comprises a PMOS transistor for amplifying the current of the second transistor and controlling the voltage driving means to pass the current to the ground voltage.

6. A buffer apparatus having a low output impedance, comprising:

a first transistor having a first terminal coupled to a voltage source, a second terminal coupled to an output terminal of the buffer, and a control terminal which receives an input signal of the buffer;

a second transistor having a first terminal coupled to the output terminal of the buffer and a control terminal which receives the input signal of the buffer;

a current sensing means, which is coupled to a second terminal of the second transistor, for sensing a current of the second transistor and amplifying an input current which flows to the second transistor;

a voltage driving means, which is formed between the output terminal of the buffer and a ground voltage, for decreasing an output voltage of the buffer by passing a current from the output terminal to the ground voltage according to a control signal which is applied to the voltage driving means; and wherein the first transistor and the second transistor comprise NMOS transistors.

7. A buffer apparatus having a low output impedance comprising:

a first transistor having a first terminal coupled to a a second terminal coupled to an output terminal of the buffer, and a control terminal which receives an input signal of the buffer;

a second transistor having a first terminal coupled to the output terminal of the buffer and a control terminal which receives the input signal of the buffer;

a current sensing means, which is coupled to a second terminal of the second transistor, for sensing a current of the second transistor and amplifying an input current which flows to the second transistor;

a voltage driving means, which is formed between the output terminal of the buffer and a ground voltage, for decreasing an output voltage of the buffer by passing a current from the output terminal to the ground voltage according to a control signal which is applied to the voltage driving means; and a bias circuit comprising:

a first PMOS transistor having a first terminal coupled to the voltage source and a second terminal coupled to the current sensing means;

a second PMOS transistor having a first terminal coupled to the voltage source, and a control terminal and a second terminal coupled to a control terminal of the first PMOS transistor;

a third PMOS transistor having a first terminal coupled to the control terminal and the second terminal of the second PMOS transistor, a control terminal and a second terminal coupled to the current sensing means and a current source;

a fourth NMOS transistor having a control terminal and a first terminal coupled to the current source, and a second terminal coupled to the ground voltage; and a fifth NMOS transistor having a first terminal coupled to the control terminal of the third transistor, a control terminal coupled to the control terminal of the fourth NMOS transistor, and a second terminal coupled to the ground voltage.

* * * * *

UNITED STATES PATENT AND TRADEMARK OFFICE
CERTIFICATE OF CORRECTION

PATENT NO. : 5,610,538

DATED : March 11, 1997

INVENTOR(S) : Kim

It is certified that error appears in the above-identified patent and that said Letters Patent is hereby corrected as shown below:

Col. 1, line 28:   delete "an" after "device is"

Col. 1, line 33:   in the equation, "31 3" should read -- -1 --

Col. 1, line 60:   delete "but" after "small,"

Col. 3, line 14:   "ciruimry" should read --circuitry--

Col. 3, line 36:   after "which is applied", insert --to--; delete "to" after "$V_{DD}$"

Col. 4, line 11:   "$1_B$" should read --$I_B$--

Col. 5, line 4:   "letteral" should read --lateral-- after "case, a"

Col. 5, line 5:   "O2" should read --Q2--

Col. 5, line 7:   "p-well" should read --P-Well--

Col. 5, line 7:   "process,." should read --process,--

Col. 5, line 9:   "n-well" should read --N-Well--

UNITED STATES PATENT AND TRADEMARK OFFICE
CERTIFICATE OF CORRECTION

PATENT NO. : 5,610,538

DATED : March 11, 1997

INVENTOR(S) : Kim

It is certified that error appears in the above-identified patent and that said Letters Patent is hereby corrected as shown below:

Col. 5, line 17: delete "a" after "has"; line 51, change "appterminaled" to --appended--.

Signed and Sealed this

Twenty-first Day of October 1997

Attest:

BRUCE LEHMAN

Attesting Officer

Commissioner of Patents and Trademarks